(12) United States Patent
Kobayashi

(10) Patent No.: US 11,189,494 B2
(45) Date of Patent: Nov. 30, 2021

(54) METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kota Kobayashi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 16 days.

(21) Appl. No.: 16/803,653

(22) Filed: Feb. 27, 2020

(65) Prior Publication Data
US 2021/0074545 A1    Mar. 11, 2021

(30) Foreign Application Priority Data

Sep. 5, 2019  (JP) .............................. JP2019-162283

(51) Int. Cl.
| | | |
|---|---|---|
| *H01L 21/322* | (2006.01) |
| *H01L 21/265* | (2006.01) |
| *H01L 21/04* | (2006.01) |
| *B23K 26/082* | (2014.01) |
| *H01L 21/268* | (2006.01) |

(52) U.S. Cl.
CPC .......... *H01L 21/265* (2013.01); *B23K 26/082* (2015.10); *H01L 21/046* (2013.01); *H01L 21/268* (2013.01)

(58) Field of Classification Search
CPC ... H01L 21/046; H01L 21/265; H01L 21/268; H01L 29/32; H01L 29/36; B23K 26/082
USPC ......................................................... 438/473
See application file for complete search history.

(56) References Cited

U.S. PATENT DOCUMENTS

| | | | |
|---|---|---|---|
| 9,691,619 B2 | 6/2017 | Kanada et al. |
| 2017/0047408 A1* | 2/2017 | Kuribayashi ..... H01L 21/02529 |
| 2018/0005829 A1* | 1/2018 | Takishita ................ H01L 29/32 |

FOREIGN PATENT DOCUMENTS

| | | |
|---|---|---|
| EP | 2674968 B1 | 2/2019 |
| JP | 2012-94698 A | 5/2012 |
| JP | 5800654 B2 | 10/2015 |
| JP | 6000015 B2 | 9/2016 |
| WO | 2014-136237 A1 | 9/2014 |

\* cited by examiner

*Primary Examiner* — Brook Kebede
(74) *Attorney, Agent, or Firm* — Allen & Overy, LLP

(57) ABSTRACT

A method of manufacturing a semiconductor device includes ion-implanting impurities into a wafer through a back surface of the wafer, a metal layer being formed on a front surface of the wafer; and activating the impurities by laser light illuminating the back surface of the wafer. The laser light is scanned on the back surface as providing a trajectory without bending. The trajectory includes curved portions intersecting in the back surface of the wafer. The laser light has a spot size on the back surface of the wafer, the spot size being larger than a distance between the curved portions adjacent to each other.

10 Claims, 7 Drawing Sheets

METHOD OF MANUFACTURING SEMICONDUCTOR DEVICE

CROSS-REFERENCE TO RELATED APPLICATIONS

This application is based upon and claims the benefit of priority from Japanese Patent Application No. 2019-162283, filed on Sep. 5, 2019; the entire contents of which are incorporated herein by reference.

FIELD

Embodiments relate to a method of manufacturing a semiconductor device.

BACKGROUND

In manufacturing processes of a semiconductor device, there are cases where impurities are ion-implanted into a semiconductor wafer through the back surface thereof after forming a metal layer such as an electrode or the like at the front surface side. In such a case, heat treatment is performed to activate the impurities, while avoiding metal migration into the semiconductor wafer from the metal layer formed on the front surface. For example, the back surface is illuminated by laser light to locally heat the region where the impurities are ion-implanted, and the laser light is scanned over the whole back surface. However, it is difficult to perform heat treatment uniformly by the laser illumination.

DETAILED DESCRIPTION

Figure 1:
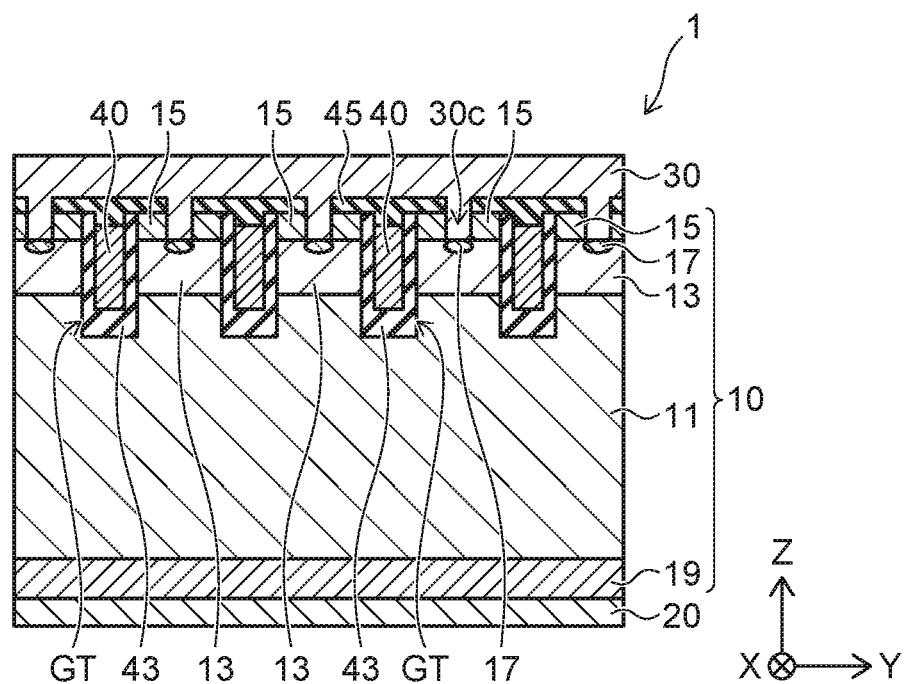
FIG. 1 is a schematic cross-sectional view showing a semiconductor device according to an embodiment.

According to one embodiment, a method of manufacturing a semiconductor device includes ion-implanting impurities into a wafer through a back surface of the wafer, a metal layer being formed on a front surface of the wafer; and activating the impurities by laser light illuminating the back surface of the wafer. The laser light is scanned on the back surface as providing a trajectory without bending. The trajectory includes curved portions intersecting in the back surface of the wafer. The laser light has a spot size on the back surface of the wafer, the spot size being larger than a distance between the curved portions adjacent to each other.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a MOSFET. The semiconductor device 1 is not limited to a MOSFET and may be, for example, a diode or an IGBT (Insulated Gate Bipolar Transistor).

The semiconductor device 1 includes a semiconductor part 10, a drain electrode 20, a source electrode 30, and a gate electrode 40. The semiconductor part 10 is, for example, silicon and is positioned between the drain electrode 20 and the source electrode 30. The drain electrode 20 is provided on the back surface of the semiconductor part 10. The source electrode 30 is provided at the front surface of the semiconductor part 10.

The gate electrode 40 is positioned between the semiconductor part 10 and the source electrode 30. The gate electrode 40 is disposed in a gate trench GT provided at the front surface side of the semiconductor part 10. The gate electrode 40 is electrically insulated from the semiconductor part 10 by a gate insulating film 43, and is electrically insulated from the source electrode 30 by an inter-layer insulating film 45.

The semiconductor part 10 includes, for example, an n-type drift layer 11, a p-type diffusion layer 13, an n-type source layer 15, a p-type contact layer 17, and an n-type drain layer 19.

The n-type drift layer 11 extends in horizontal directions (e.g., the X direction and the Y direction) along the drain electrode 20 and spreads over the entire semiconductor part 10. The n-type drift layer 11 includes, for example, an n-type impurity with a low concentration.

The p-type diffusion layer 13 is positioned between the n-type drift layer 11 and the source electrode 30. For example, the p-type diffusion layer 13 is disposed between the gate electrodes 40 adjacent to each other in the X direction. The p-type diffusion layer 13 is disposed to face the gate electrode 40 with the gate insulating film 43 interposed.

The n-type source layer 15 is formed between the p-type diffusion layer 13 and the source electrode 30. The n-type source layer 15 includes an n-type impurity with a higher concentration than the n-type impurity of the n-type drift layer 11.

The p-type contact layer 17 is formed selectively between the p-type diffusion layer 13 and the source electrode 30. For example, the p-type contact layer 17 is provided inside the p-type diffusion layer 13 and includes a p-type impurity with a higher concentration than the p-type impurity of the p-type diffusion layer 13.

The n-type source layer 15 and the p-type contact layer 17 are electrically connected to the source electrode 30. The source electrode 30 includes, for example, a contact portion 30c extending into the semiconductor part 10. The n-type source layer 15 and the p-type contact layer 17 are in contact with and electrically connected to the contact portion 30c. The p-type diffusion layer 13 is electrically connected to the source electrode 30 via the p-type contact layer 17.

The n-type drain layer 19 is provided between the n-type drift layer 11 and the drain electrode 20. The n-type drain layer 19 includes an n-type impurity with a higher concentration than the n-type impurity of the n-type drift layer 11. For example, the drain electrode 20 is in contact with and electrically connected to the n-type drift layer 11.

A method of manufacturing the semiconductor device 1 will now be described with reference to FIG. 2A to FIG. 4B. FIG. 2A to FIG. 4B are schematic cross-sectional views showing manufacturing processes of the semiconductor device 1 in order.

Figure 2A:
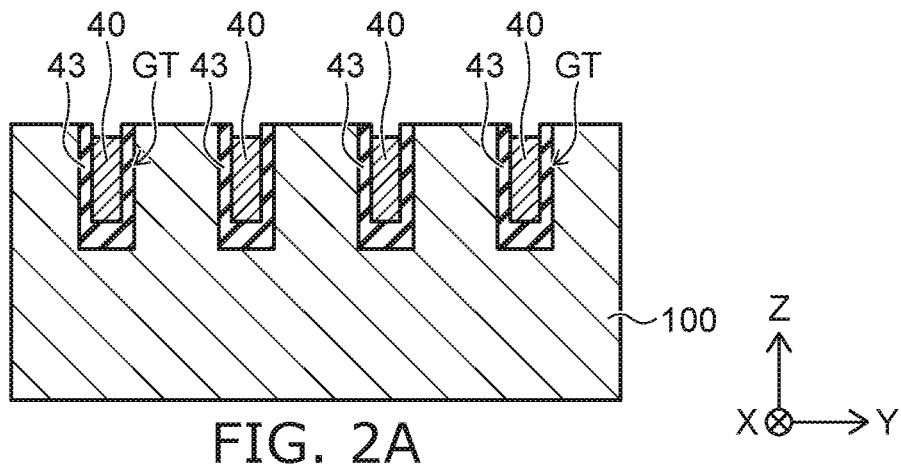
FIG. 2A to FIG. 4B are schematic cross-sectional views showing manufacturing processes of the semiconductor device according to an embodiment.

As shown in FIG. 2A, the gate electrode 40 that has a trench gate structure is formed at the front surface of a wafer 100. The wafer 100 is, for example, an n-type silicon wafer and includes an n-type impurity with the same concentration as the n-type impurity of the n-type drift layer 11. The gate electrode 40 is filled into the gate trench GT after the gate insulating film 43 is formed in the gate trench GT.

For example, after forming the gate trench GT in the front surface of the wafer 100, the gate insulating film 43 is formed by thermal oxidation of the wafer 100. The gate insulating film 43 is, for example, a silicon oxide film.

Continuing, a conductive polysilicon layer is formed to fill the gate trench GT; subsequently, the polysilicon layer is removed so that the portion filling the gate trench GT remains. In other words, the gate electrode 40 is, for example, a conductive polysilicon layer.

Figure 2B:
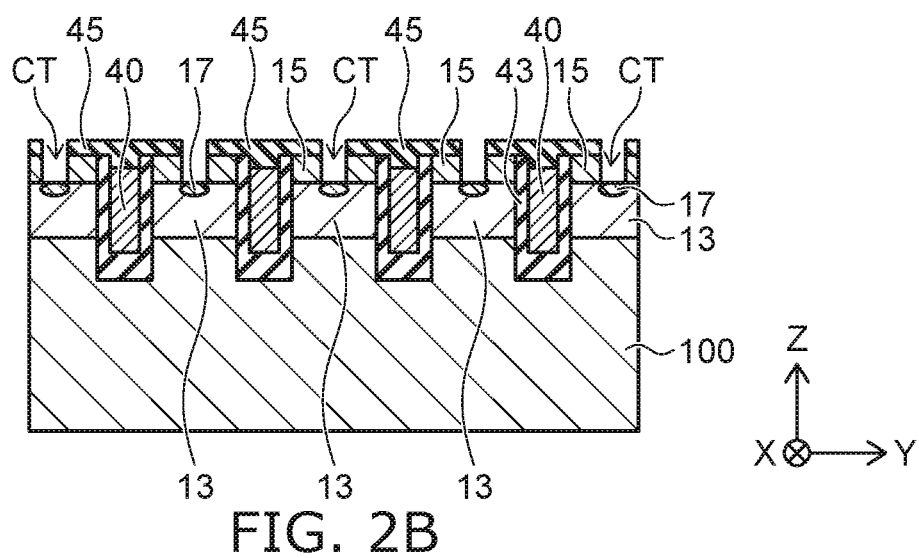

As shown in FIG. 2B, the p-type diffusion layer 13, the n-type source layer 15, and the p-type contact layer 17 are formed at the front surface of the wafer 100.

For example, the p-type diffusion layer 13 is formed by ion-implanting a p-type impurity into the front surface of the wafer 100 and by subsequently activating and diffusing by heat treatment. For example, heat treatment of the wafer 100 into which the p-type impurity is ion-implanted is performed under prescribed conditions by using an electric furnace. The p-type diffusion layer 13 includes the p-type impurity with a higher concentration than the n-type impurity of the wafer 100. The p-type impurity is, for example, boron (B).

For example, the n-type source layer 15 is formed by ion-implanting, for example, an n-type impurity into the front surface of the p-type diffusion layer 13 and subsequently by activating by heat treatment. For example, the n-type source layer 15 is formed by performing heat treatment of the wafer 100 into which the n-type impurity is ion-implanted in an electric furnace for a shorter period of time than that of the heat treatment of the impurity of the p-type diffusion layer 13. The n-type source layer 15 is formed at the front surface of the p-type diffusion layer 13. The n-type impurity is, for example, phosphorus (P).

Continuing, the inter-layer insulating film 45 is formed to cover the gate electrode 40; subsequently, a contact trench CT is formed. The inter-layer insulating film 45 is, for example, a silicon oxide film formed using CVD (Chemical Vapor Deposition). For example, the contact trench CT is formed to a depth piercing the inter-layer insulating film 45 and the n-type source layer 15 to reach the p-type diffusion layer 13.

The p-type contact layer 17 is formed by selectively ion-implanting a p-type impurity into the bottom surface of the contact trench CT. For example, the p-type contact layer 17 is formed by performing heat treatment of the wafer 100 into which the p-type impurity is ion-implanted in an electric furnace for a shorter period of time than that of the heat treatment of the impurity of the p-type diffusion layer 13. The p-type impurity is, for example, boron (B).

Figure 2C:
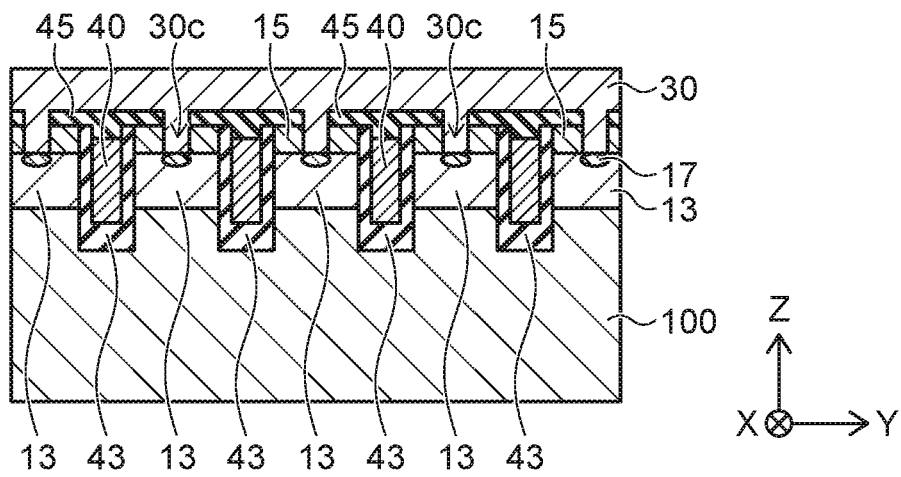

As shown in FIG. 2C, the source electrode 30 is formed at the front surface of the wafer 100. The source electrode 30 is, for example, a metal layer including tungsten and aluminum. The source electrode 30 includes the contact portion 30c filling the contact trench CT. The contact portion 30c is in contact with and electrically connected to the n-type source layer 15 and the p-type contact layer 17 in the contact trench CT. The n-type source layer 15 is exposed at the inner wall of the contact trench CT; and the p-type contact layer 17 is exposed at the bottom surface of the contact trench CT.

Figure 3A:
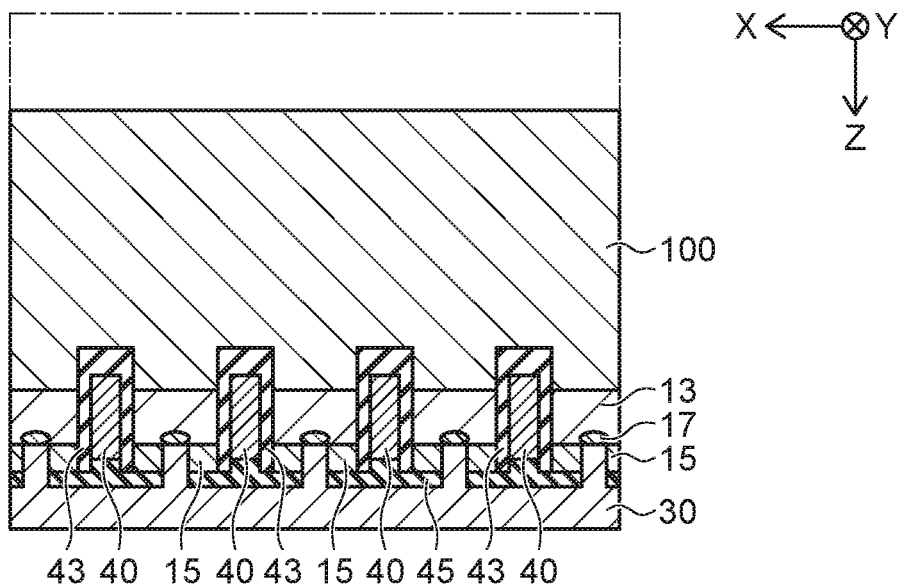

As shown in FIG. 3A, after forming the MOS (Metal Oxide Semiconductor) structure at the front surface of the wafer 100, the wafer 100 is thinned to the desired chip thickness by polishing or etching the back surface.

Figure 3B:
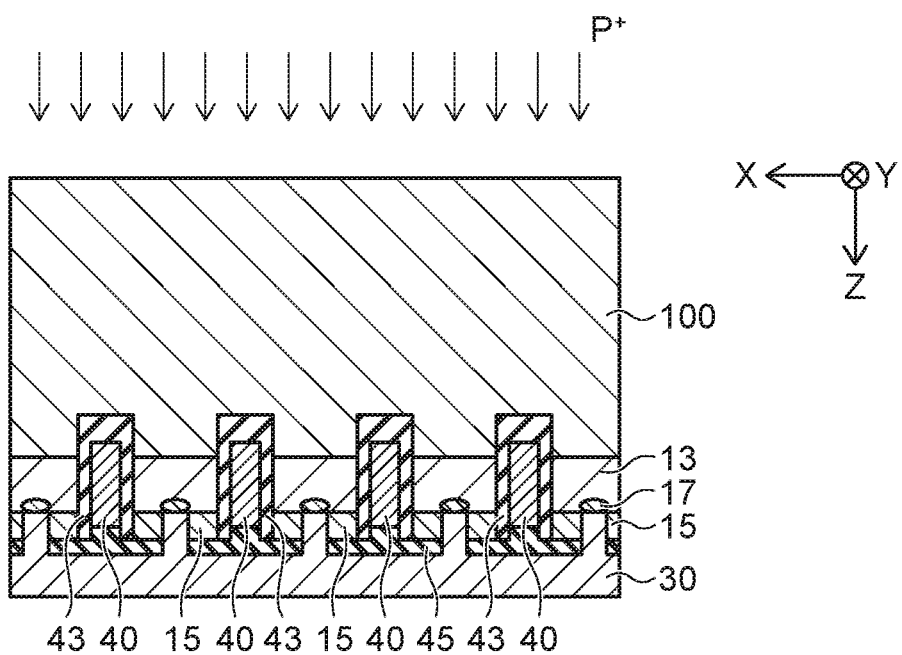

As shown in FIG. 3B, for example, an n-type impurity is ion-implanted into the back surface of the wafer 100. The n-type impurity is, for example, phosphorus (P).

Figure 4A:
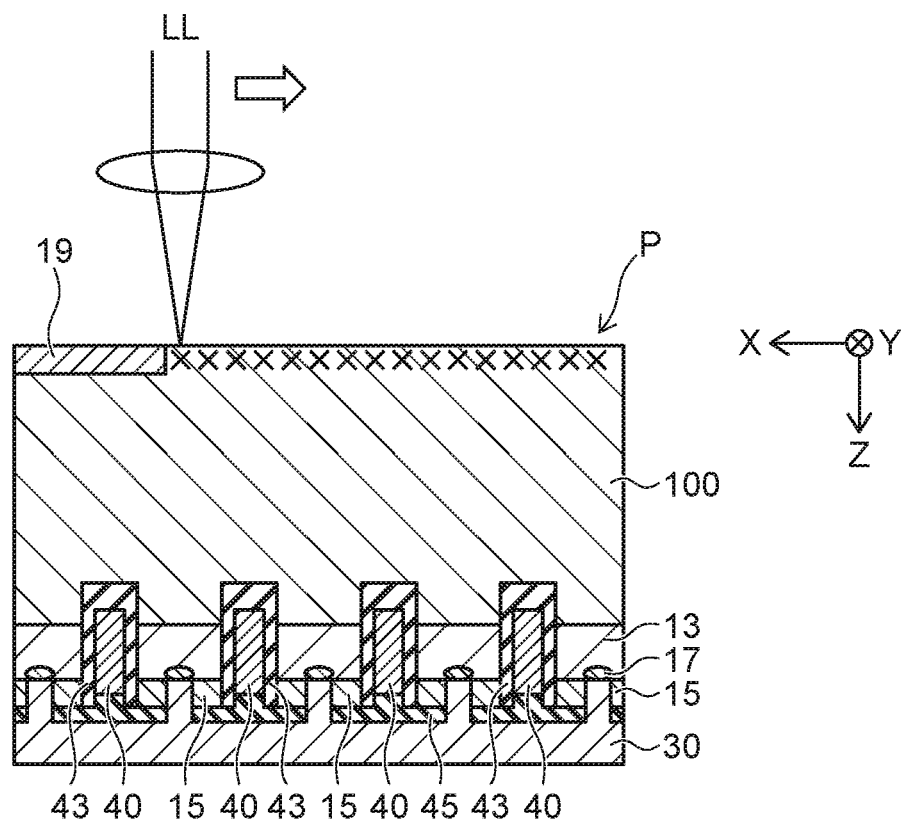

As shown in FIG. 4A, a laser light LL illuminates the back surface of the wafer 100; and the region where the n-type impurity is ion-implanted is heated locally. The laser light LL is scanned along the back surface to illuminate the entire back surface of the wafer 100.

In the region illuminated by the laser light LL, the n-type impurity is activated; and the n-type drain layer 19 is formed, Meanwhile, the temperature increase of the front surface of the wafer 100 is suppressed to a prescribed temperature, e.g., 400° C. or less. Thereby, the migration of the metal atoms included in the source electrode 30 can be suppressed; and the characteristic degradation of the MOS structure can be avoided.

Figure 4B:
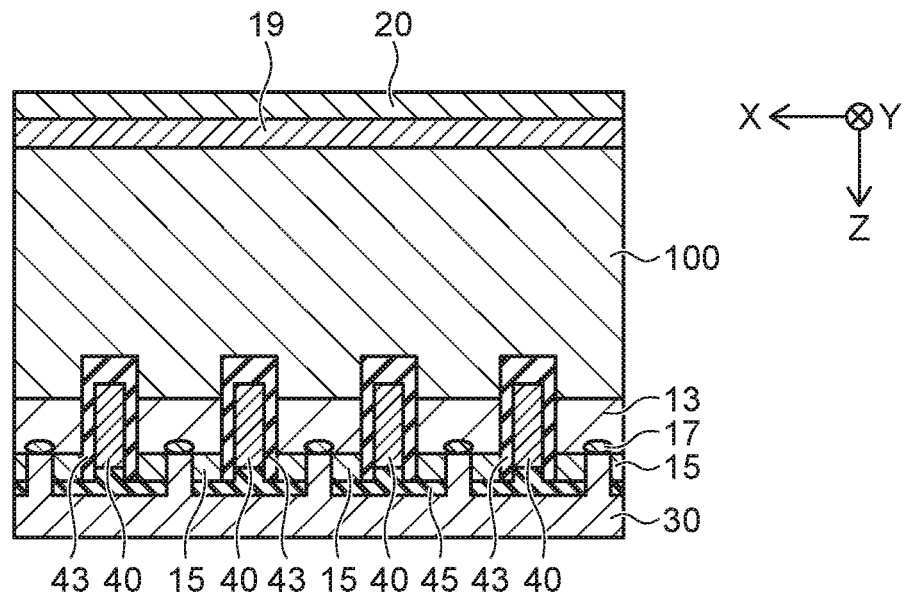

As shown in FIG. 4B, the drain electrode 20 is formed on the back surface of the wafer 100; and the semiconductor device 1 is completed. The drain electrode 20 is, for example, a metal layer including gold (Au), germanium (Ge), etc. The portion of the wafer 100 positioned between the p-type diffusion layer 13 and the n-type drain layer 19 is used to form the n-type drift layer 11.

Figure 5A:
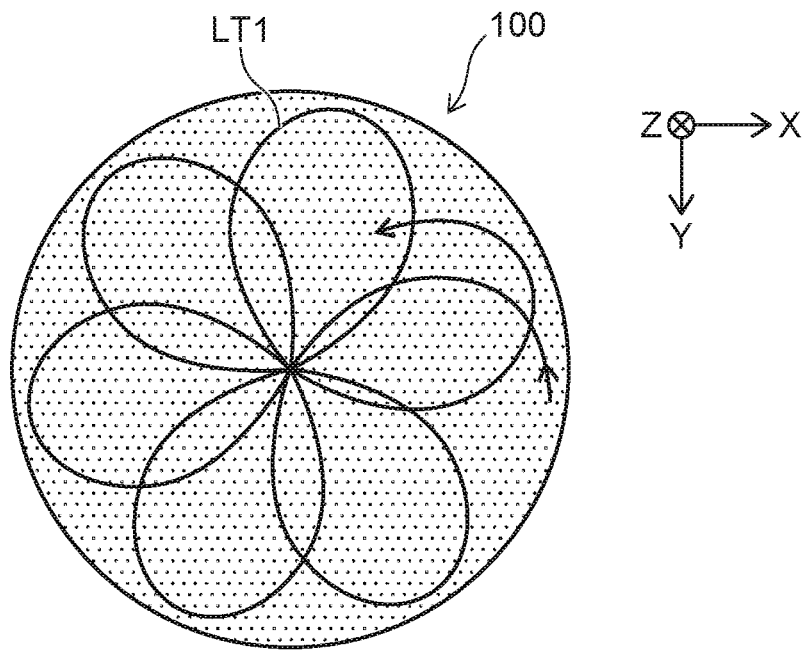
FIG. 5A is a schematic view showing the method of scanning the laser light according to the embodiment.
Figure 5B:
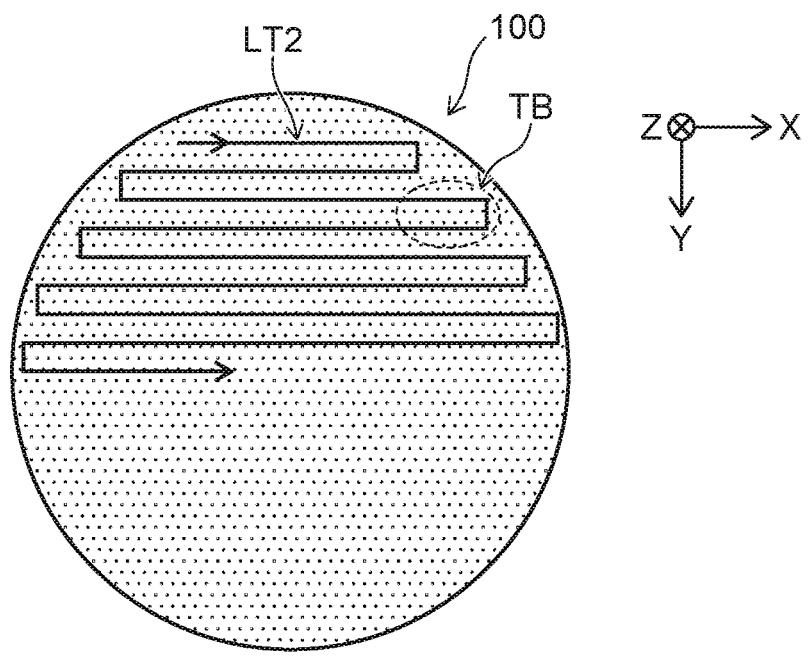
FIG. 5B is a schematic view showing a method of scanning the laser light according to a comparative example.

FIGS. 5A and 5B are schematic plan views showing trajectories LT1 and LT2 of the laser light LL illuminating the back surface of the wafer 100. FIG. 5A is a schematic view showing the method of scanning the laser light according to the embodiment. FIG. 5B is a schematic view showing a method of scanning the laser light according to a comparative example. It should be noted that the trajectories LT1 and LT2 of the laser light LL are illustrated for convenience to show the scanning methods and are not actually provided on the back surface of the wafer 100.

As shown in FIG. 5A, the laser light LL is scanned as providing the trajectory LT1 without bending and including curved portions intersecting multiple times. In other words, the trajectory LT1 is provided to have a curvature changing continuously in the back surface of the wafer 100. Also, the laser light LL is scanned as providing the trajectory LT1 intersecting at the center of the wafer 100. The laser light LL is scanned as providing a so-called trochoid on the back surface of the wafer 100. In this process, the laser light LL does not illuminate outside the back surface of the wafer 100.

In the example (the trajectory LT2) shown in FIG. 5B, the laser light LL is scanned, for example, in the X direction and in the reverse direction, i.e., the −X direction, on the back surface of the wafer 100. Also, when turning around from the X direction to the −X direction and when reversely turning around at the outer edges of the wafer 100, the laser light LL is shifted in the Y direction at a constant spacing to illuminate the entire back surface.

According to the scanning method shown in FIG. 5B, for example, the scanning in the X direction is performed to reach the outer edge of the wafer 100, and then promptly scanned in the −X direction. For example, in a region TB shown in FIG. 5B, the portion illuminated by the scanning in the X direction is positioned at the vicinity of the portion illuminated by the scanning in the −X direction. In other words, in the region TB, the laser light LL illuminates the portion positioned at the vicinity of the portion illuminated by the scanning in the X direction before the heat of the portion illuminated by the scanning in the X direction dissipates. Therefore, for example, the heat treatment temperature in the region TB is higher than the heat treatment temperature of a portion positioned at the center of the wafer 100. As a result, the activation rate or the diffusion degree of the impurities implanted into the back surface of the wafer 100 is different between the center of the wafer 100 and the region TB.

Conversely, in the scanning method shown in FIG. 5A, the scanning direction is not reversed in a short period of time; and the laser light LL does not illuminate the vicinity of the portion heated by the illumination of the laser light LL before the heat of the portion dissipates. Accordingly, a heat treatment temperature difference such as that recited above does not occur; and uniform heat treatment of the entire back surface of the wafer 100 is possible.

In the scanning method according to the embodiment, the trajectories of the scanning intersect; therefore, there are portions that are illuminated with the laser light LL multiple times; however, as long as the heat of the portion once illuminated dissipates sufficiently, the temperature does not increase to a high temperature due to the next illumination. Accordingly, the heat treatment of the entire back surface of the wafer 100 at a uniform temperature is possible.

On the other hand, the activation rate and the diffusion degree of the ion-implanted impurities is dependent more on the temperature than on the number of the heat treatments. Accordingly, more uniform heat treatment can be realized using the scanning method shown in FIG. 5A than when using the scanning method shown in FIG. 5B.

Figure 6:
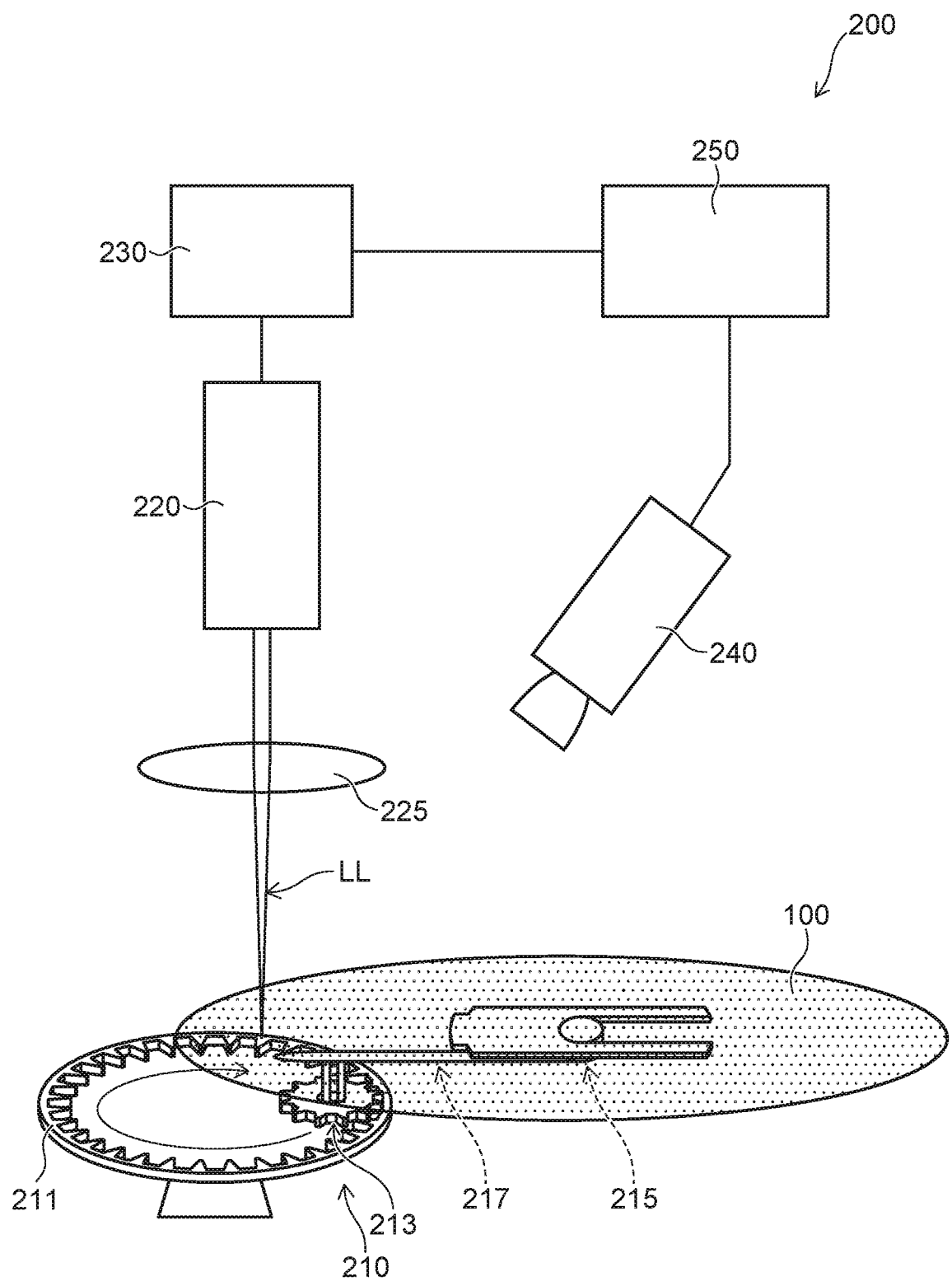
FIG. 6 is a schematic view showing a laser annealing apparatus according to the embodiment.
Figure 7A:
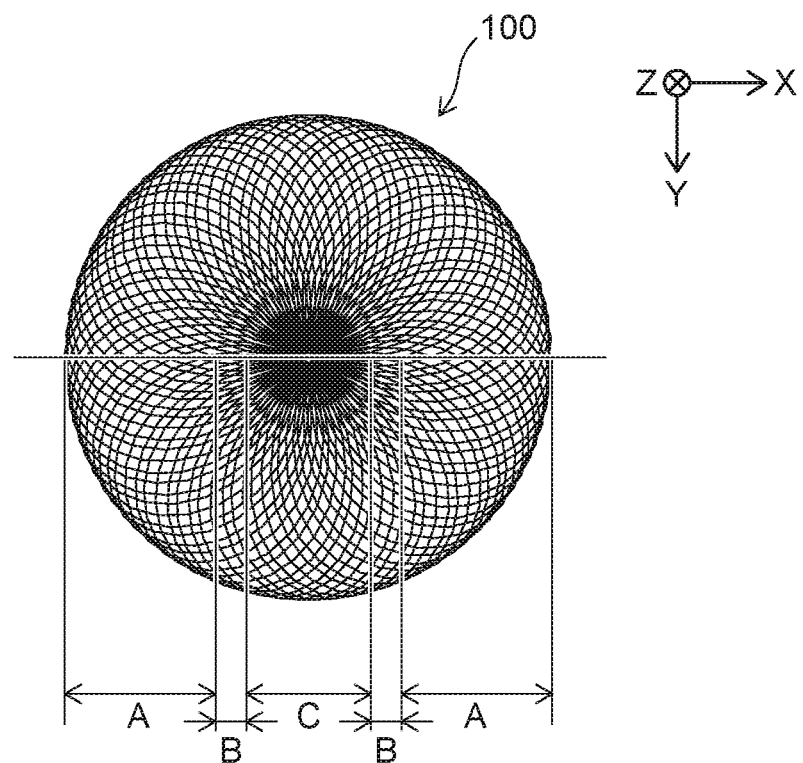
FIGS. 7A and 7B are schematic views showing the laser annealing according to the embodiment.
Figure 7B:
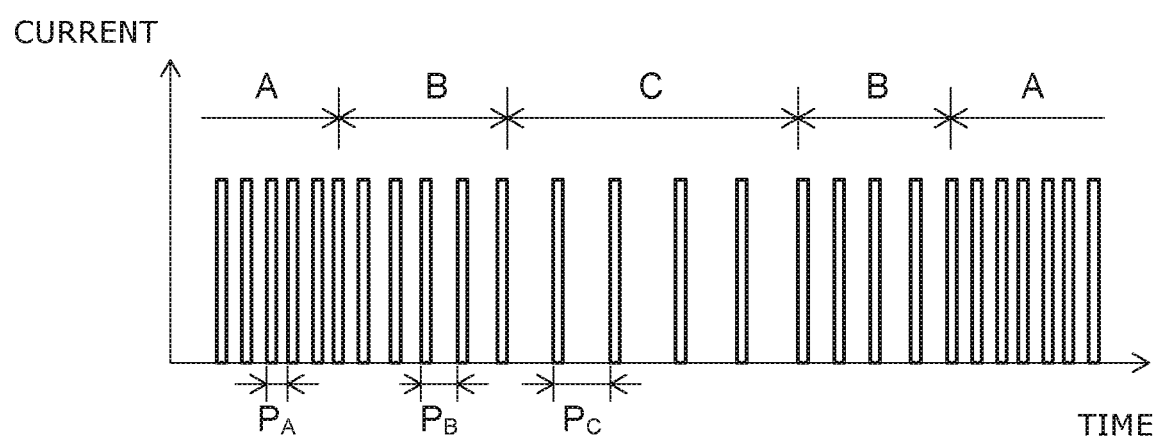

The method of scanning the laser light LL according to the embodiment will now be described with reference to FIG. 6, FIG. 7A, and FIG. 7B. FIG. 6 is a schematic view showing a laser annealing apparatus 200 according to the embodiment. FIGS. 7A and 7B are schematic views showing the laser annealing according to the embodiment.

The laser annealing apparatus 200 includes, for example, a stage 210, a laser part 220, a power supply part 230, an imager 240, and a controller 250.

As shown in FIG. 6, the stage 210 includes, for example, a gear 211, a gear 213, and a holder 215. The gear 211 is an internal gear; and the gear 213 is disposed at the inner side of the gear 211 and includes external teeth meshing with the internal teeth of the gear 211. The gear 213 moves while rotating along the inner surface of the gear 211. The holder 215 is connected to the rotation axis of the gear 213 by a support rod 217 having a prescribed length. For example, the gear 213 rotates at a constant speed.

The laser part 220 includes, for example, a semiconductor laser and illuminates the wafer 100 held by the holder 215 with the laser light LL. For example, the laser light LL is concentrated on the back surface of the wafer 100 by a lens 225. The spot diameter of the laser light LL is controlled by the lens 225.

The power supply part 230 drives the laser part 220. For example, the laser part 220 performs pulse driving by using a drive current supplied from the power supply part 230. The laser part 220 and the power supply part 230 may be configured in an integral body.

The imager 240 is configured to image the wafer 100 and to detect, for example, the illumination position of the laser light LL. The controller 250 controls the power supply part 230 and the imager 240 to perform the laser annealing of the wafer 100.

FIG. 7A is a schematic plan view showing the trajectory of the laser light LL scanned along the back surface of the wafer 100. FIG. 7B is a schematic view showing the current waveform supplied from the power supply part 230 to the laser part 220.

For example, the laser light LL is scanned as providing the trochoid shown in FIG. 7A. For example, the laser light LL is scanned in the wafer 100 while the wafer 100 held by the stage 210 moves as the gear 213 turns along the gear 211.

For example, the coordinates (x, y) of the trajectory of the laser light LL on the back surface of the wafer 100 follow the following formula.

$$x = (r_c - r_m)\cos\theta + r_d \cos\left(\frac{r_c - r_m}{r_m}\theta\right)$$
$$y = (r_c - r_m)\sin\theta + r_d \sin\left(\frac{r_c - r_m}{r_m}\theta\right)$$

Here, $r_c$ is the inner diameter of the external gear 211 (the fixed circle radius); and $r_m$ is the radius of the internal gear 213 (the rolling circle radius). $r_d$ is the distance (the tracing point radius) between the center of the external gear 211 and the center of the wafer 100 when viewed from above. Also, $\theta$ is the rotation angle of the internal gear 213. For example, when $r_c$=60 mm, $r_m$=9.4 mm, $r_d$=49 mm, and $0 \le \theta \le 2n\pi$ are set, the laser light LL is scanned as providing the trajectory shown in FIG. 7A along the back surface of an 8-inch wafer.

According to the trajectory of the laser light LL shown in FIG. 7A, the back surface of the wafer 100 can be divided into, for example, three regions A, B, and C. The region C is positioned at the center of the back surface of the wafer 100; and the region B surrounds the region C. The region A surrounds the region B.

The density of the trajectory of the laser light LL in the region B is higher than the density of the trajectory in the region A; and the density of the trajectory in the region C is higher than the density of the trajectory in the region B. For example, if the illumination intensity of the laser light LL is constant and the illumination is performed at a constant time interval, the cumulative illumination energy per unit area (hereinbelow, the cumulative illumination energy) of the laser light LL for each region is more in the region B than in the region A, and more in the region C than in the region B.

Also, the spot diameter of the laser light LL is controlled using the lens 225 so that the laser light LL illuminates the entire back surface of the wafer 100. For example, the spot diameter of the laser light LL is set to be equal to or wider than the widths of the trajectories adjacent to each other in a direction intersecting the scanning direction at each position in the region A. For example, the spot diameter of the laser light LL is set based on the largest distance between the trajectories adjacent to each other.

As shown in FIG. 7B, the pulse current that is supplied to the laser part 220 has three pulse intervals $P_A$, $P_B$, and $P_C$ ($P_A < P_B < P_C$). The controller 250 controls the pulse interval based on the illumination position of the laser light LL detected by the imager 240. For example, the pulse interval while scanning through the region A is $P_A$; and the pulse interval while scanning through the region B is $P_B$. The pulse interval while scanning through the region C is $P_C$.

For example, even if the heat treatment temperature due to the laser light LL is uniform between the regions A to C, if the cumulative illumination energy difference between the regions becomes large, the activation rate or the diffusion degree of the ion-implanted impurities changes and is dependent on the cumulative illumination energy difference. In the method of scanning the laser light LL according to the embodiment, the cumulative illumination energy difference of the laser light LL between the regions A to C can be suppressed by changing the pulse interval of the pulse current supplied to the laser part 2203. Thereby, uniform heat treatment can be performed over the entire back surface of the wafer 100.

The scanning methods recited above are examples and are not limited thereto. For example, the scanning of the laser light LL may control in the two regions of the region A and the region C without setting the region B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the method comprising:
   ion-implanting impurities into a wafer through a back surface of the wafer, a metal layer being formed on a front surface of the wafer; and
   activating the impurities by laser light illuminating the back surface of the wafer, the laser light being scanned on the back surface as providing a trajectory without bending, the trajectory including curved portions intersecting in the back surface of the wafer, the laser light having a spot size on the back surface of the wafer, the spot size being larger than a distance between the curved portions adjacent to each other.

2. The method according to claim 1, wherein the laser light is radiated from a laser device driven by a pulse current, the pulse current being continuous, the pulse current has a first period while the laser light illuminates a first region on the back surface of the wafer, and the pulse current has a second period longer than the first period while the laser light illuminates a second region on the back surface, a density of the trajectory being higher in the second region than in the first region.

3. The method according to claim 2, wherein the laser light is scanned as providing a trajectory intersecting multiple times at a center of the back surface of the wafer, the second region is positioned at the center of the back surface, and the first region surrounds the second region.

4. The method according to claim 2, wherein the wafer includes a third region positioned between the first region and the second region in the back surface, a density of the trajectory in the third region is higher than in the first region and lower than in the second region, and while the laser light illuminates the third region, the pulse current has a third period longer than the first period and shorter than the second period.

5. The method according to claim 4, wherein a boundary between the first region and the third region and a boundary between the second region and the third region each are provided with a concentric circle shape sharing a center of the back surface of the wafer.

6. The method according to claim 1, wherein the laser light is scanned as providing a trochoid on the back surface of the wafer.

7. The method according to claim 1, wherein the laser light is scanned on the back surface of the wafer as providing a trajectory expressed by $$x = (r_c - r_m) \cos\theta + r_d \cos\left(\frac{r_c - r_m}{r_m}\theta\right)$$

$$y = (r_c - r_m) \sin\theta + r_d \sin\left(\frac{r_c - r_m}{r_m}\theta\right)$$

wherein "$r_c$" is fixed circle radius, "$r_m$" is rolling circle radius, "$r_d$" is tracing point radius, and "$\theta$" is rotation angle.

8. The method according to claim 1, wherein the trajectory of the laser light is provided continuously in the back surface of the wafer.

9. The method according to claim 8, wherein the trajectory of the laser light has a curvature changing continuously in the back surface of the wafer.

10. The method according to claim 1, wherein the ion-implanting of the impurities is performed after forming a MOS structure including the metal layer on the front surface of the wafer.

* * * * *